United States Patent
Varshney et al.

(10) Patent No.: US 9,147,656 B1
(45) Date of Patent: Sep. 29, 2015

(54) SEMICONDUCTOR DEVICE WITH IMPROVED SHIELDING

(71) Applicants: Sumit Varshney, Noida (IN); Rishi Bhooshan, Ghaziabad (IN); Meng Kong Lye, Shah Alam (MY); Chetan Verma, Noida (IN)

(72) Inventors: Sumit Varshney, Noida (IN); Rishi Bhooshan, Ghaziabad (IN); Meng Kong Lye, Shah Alam (MY); Chetan Verma, Noida (IN)

(73) Assignee: FREESCALE SEMICONDUTOR, INC., Austin, TX (US)

( * ) Notice: Subject to any disclaimer, the term of this patent is extended or adjusted under 35 U.S.C. 154(b) by 0 days.

(21) Appl. No.: 14/328,711

(22) Filed: Jul. 11, 2014

(51) Int. Cl.
H01L 23/495 (2006.01)
H01L 23/552 (2006.01)
H01L 23/522 (2006.01)

(52) U.S. Cl.
CPC ........ *H01L 23/5225* (2013.01); *H01L 23/4952* (2013.01); *H01L 23/49555* (2013.01)

(58) Field of Classification Search
CPC .............................. H01L 23/552; H01L 24/49
USPC ........................... 257/659, 660, 666, E23.031
See application file for complete search history.

(56) References Cited

U.S. PATENT DOCUMENTS

| | | | |
|---|---|---|---|
| 5,359,222 A | 10/1994 | Ikemizu | |
| 5,442,228 A * | 8/1995 | Pham et al. | 257/659 |
| 5,869,898 A * | 2/1999 | Sato | 257/728 |
| 5,976,915 A | 11/1999 | Ma | |
| 6,166,429 A | 12/2000 | Ishida et al. | |
| 7,582,951 B2 * | 9/2009 | Zhao et al. | 257/660 |
| 7,875,963 B1 * | 1/2011 | Kim et al. | 257/670 |
| 8,003,443 B2 | 8/2011 | Punzalan et al. | |
| 8,283,757 B2 | 10/2012 | Chen et al. | |
| 2005/0121752 A1 * | 6/2005 | Lee | 257/666 |
| 2006/0145341 A1 * | 7/2006 | Jiang et al. | 257/734 |
| 2008/0290483 A1 * | 11/2008 | Yurino | 257/670 |
| 2011/0089556 A1 * | 4/2011 | Lee et al. | 257/692 |
| 2011/0111562 A1 * | 5/2011 | San Antonio et al. | 438/113 |
| 2013/0082371 A1 | 4/2013 | Chen | |

* cited by examiner

*Primary Examiner* — Nitin Parekh
(74) *Attorney, Agent, or Firm* — Charles Bergere

(57) ABSTRACT

A shielding structure for use with semiconductor devices. The shielding structure has a base with fingers that are sized and shaped to extend within the space between pairs of adjacent leads. The base extends within the space between the die flag and the leads. The shielding structure is further connected to one of the grounded leads.

13 Claims, 2 Drawing Sheets

SEMICONDUCTOR DEVICE WITH IMPROVED SHIELDING

BACKGROUND OF THE INVENTION

The present invention relates generally to semiconductor devices and, more particularly, to improved shielding for semiconductor devices.

One type of semiconductor devices uses lead frames having leads that are electrically connected to the integrated circuit die with bond wires. The leads are used to transmit signals to/from the integrated circuit. Adjacent signal leads may couple to one another. This is referred to as "crosstalk" or "cross-coupling," where variations in one signal can affect amplitudes of nearby signals. In order to reduce the coupling between two signals, a ground shield may be provided between the leads.

In semiconductor packages that have only a few leads (e.g., 6-10), portions of the lead frame flag (a.k.a. die paddle) may be cut in order to provide a ground shield. However, this approach is not practical for semiconductor packages with a large number of leads. Another approach is to connect every other lead to ground to avoid coupling. However, this limits the number of leads that may be used to carry signals. Accordingly, it would be advantageous to be able to shield signals of devices with many leads.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments of the present invention, shielding structures are provided for lead frames to protect signal leads from experiencing cross-coupling.

In one embodiment, the present invention provides a lead frame for a semiconductor device. The lead frame comprises a die flag, a plurality of leads surrounding the die flag, and a shielding structure. The shielding structure comprises a base located between the die flag and the leads, and a plurality of fingers. Each of the fingers extends from the base between a different pair of adjacent leads.

Figure 1A:
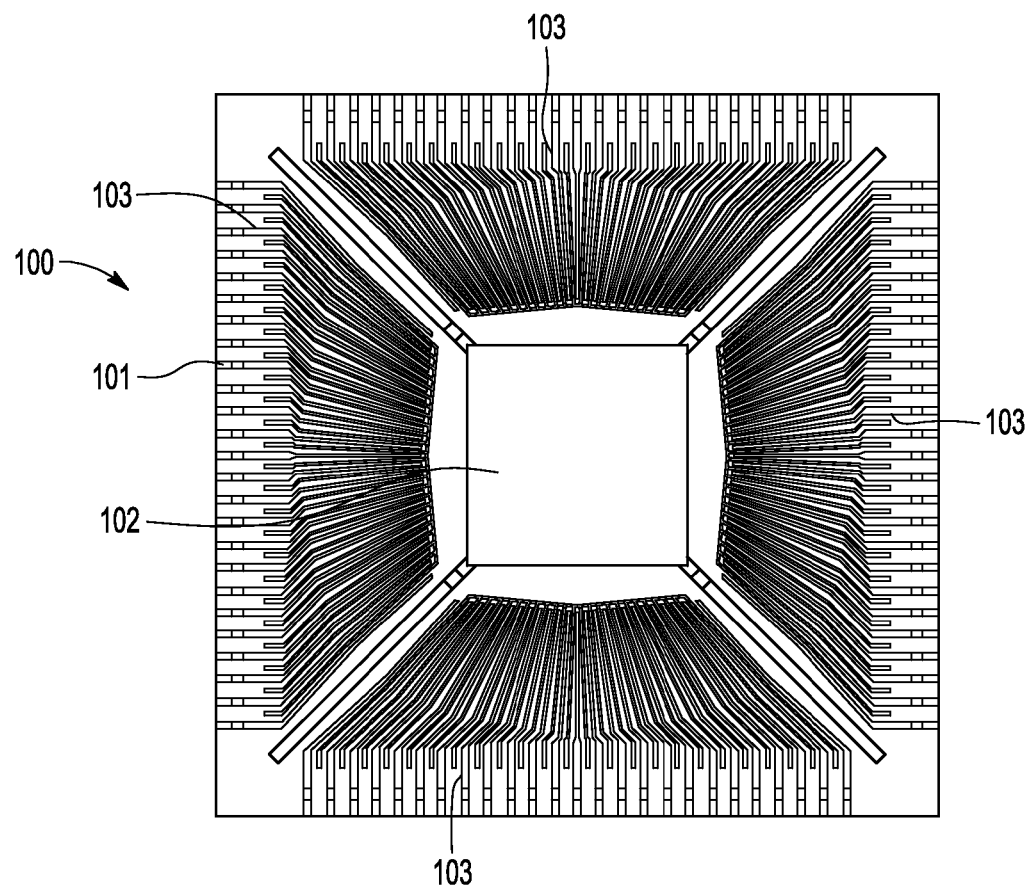
FIG. 1A is a simplified top plan view of a lead frame for a semiconductor device, the lead frame having a shielding structure, in accordance with an embodiment of the present invention.

Referring now to FIG. 1A, a simplified top plan view of an exemplary lead frame 100 for a semiconductor device in accordance with an embodiment of the present invention is shown. A lead frame is a collection of metal leads and possibly other elements (e.g., die paddles, power bars) that is used in semiconductor packaging for assembling a single packaged semiconductor device. Prior to assembly, a lead frame may have support structures (e.g., a rectangular metal frame) that keep those elements in place. During the assembly process, the support structures may be removed. As used herein, the term "lead frame" is used to refer to the collection of elements both before and after assembly, regardless of the presence or absence of any support structures.

The lead frame 100 comprises leads 101 and a die flag 102, where the leads 101 surround the die flag 102. In a packaged semiconductor device, the leads 101 can carry signals to and/or from a die (not shown) that will be die-bonded (attached) to the die flag 102. Shielding structures 103 are shown located between the leads 101 themselves, and between the leads 101 and the die flag 102, as will be described in more detail below with reference to FIG. 1B. In the embodiment shown in FIG. 1A, four separate shielding structures 103 are shown, with one placed in each quadrant of the lead frame 100. However, it should be understood that fewer shielding structures may be used in a semiconductor device depending on which leads need to be shielded.

Figure 1B:
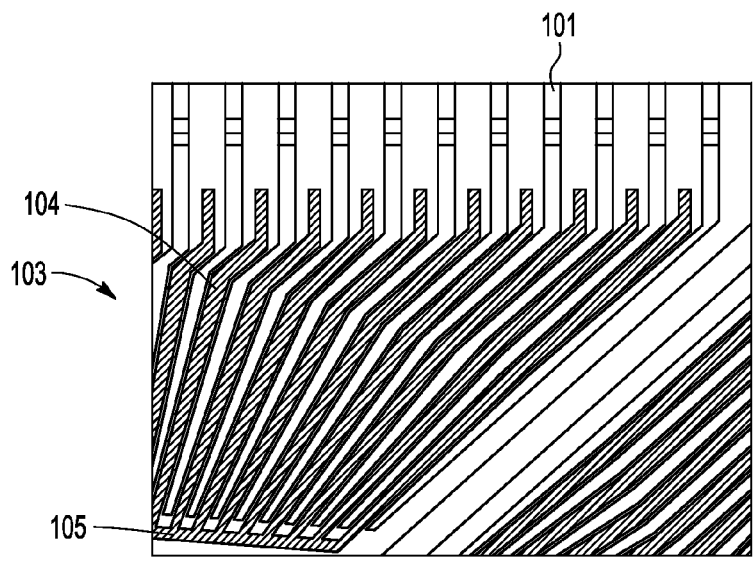
FIG. 1B is an enlarged view of a portion of the lead frame and shielding structure shown in FIG. 1A.

FIG. 1B shows a close-up view of a portion of one of the four shielding structures 103 of FIG. 1A. The shielding structure 103 comprises a plurality of elongated fingers 104 and a base 105. Each of the elongated fingers 104 extends from the base 105 between a different adjacent pair of the leads 101. The shielding structure 103 is made of metal (e.g., copper) or other suitable conducting material.

The length of each finger 104 is designed to extend as long as the corresponding pair of leads 101 may require shielding. In FIG. 1B, the fingers 104 extend until the overall cross-coupling between adjacent leads 101 is at a sufficiently low level. Further, the fingers 104 are shaped to conform to the space formed between a pair of adjacent leads 101. For example, some of the fingers 104 bend or slant in order to conform to the space formed between a pair of adjacent leads. Additionally, the width of a finger 104 might not be uniform, with the width of the finger 104 decreasing or increasing along its length. Further, the lengths of different fingers 104 may vary. Thus, the length and width of the fingers 104 will be adapted to fit within the space that exists between a pair of leads that can benefit from shielding.

Each of the fingers 104 is connected to the base 105, which extends along the space between the ends of the leads 101 and the die flag 102 (shown in FIG. 1A). As shown in FIG. 1B, the fingers 104 are integral with the base 105. The base 105 is shaped and structured so that each of the fingers 104 may be connected thereto and still remain between the leads 101.

Additionally, at least some of the fingers 104 extend at angles other than 90 degrees from the base 105 in order to conform to the space between pairs of adjacent leads with different fingers 104 extending at different angles. The elongated fingers 104 also can be insulated or coated with an organic material in order to provide electrical isolation. When the elongated fingers 104 are insulated or coated with an organic material, no spacing is required between the elongated fingers 104 and the adjacent leads 101.

In order to provide shielding for adjacent leads, in one embodiment, the base 105 is connected, such as with a bond wire, to a grounded lead or other lead frame structure that supplies ground voltage. That is, as is known by those of skill in the art, some of the leads 101 are connected to ground, so one or more of these (grounded) leads also is connected to the base 105, which thus grounds the shielding structure 103. Connecting a grounded structure to the base of the shielding structure 103 grounds all of the fingers 104 connected to the base 105. In alternative embodiments, the base 105 may be connected to a ground pad located on a die. Note that the base 105 may function as a grounded power bar for the packaged semiconductor device.

Figure 1C:
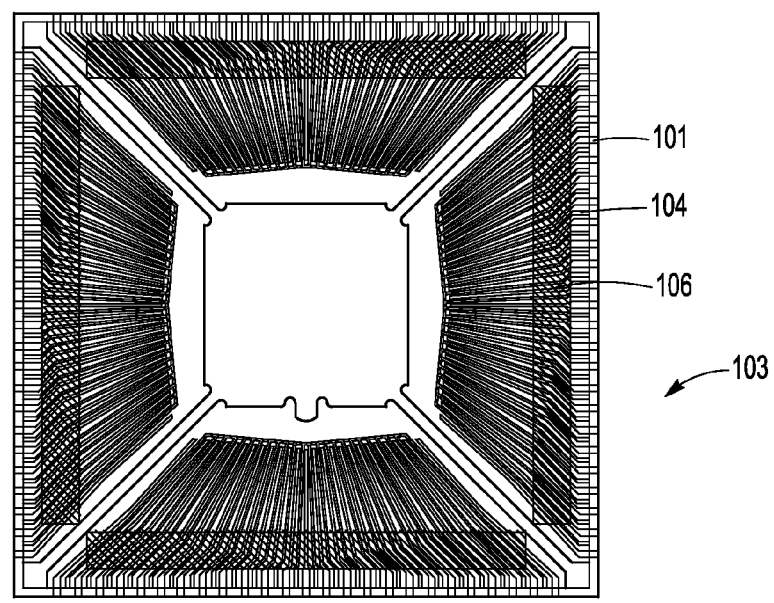
FIG. 1C is a simplified top plan view of the lead frame and shielding structure of FIG. 1A during a stage in the assembly of the semiconductor device.

FIG. 1C is a top down view of the shielding structure 103 during a stage in the assembly of the semiconductor device, that illustrates how the fingers 104 are kept in place between the leads 101 during assembly of the semiconductor device. In one embodiment, the fingers 104 are held in place between the leads 101 with tape 106, which extends across each of the fingers 104 of each shielding structure 103. The tape 106 may be made of polymide, or other suitable material.

While the shielding structures described above show fingers between each of the leads, it should be understood that shielding structures may have fewer fingers in those instances where certain pairs of adjacent leads do not require shielding.

By providing a shielding structure that is capable of being placed between the leads, all leads are able to be shielded without sacrificing the use of any of the leads. Furthermore, in some embodiments, the shielding structure is electrically isolated from the die flag, which enables the shielding structure to be used in multiple types of semiconductor devices.

The lead frame 100 may be manufactured by stamping, etching, or other suitable techniques. In some embodiments of the invention, after formation of the shielding structure 103 and the leads 101 during a first stamping procedure, the ends of the fingers 104 and the leads 101 remain connected to each other by support structures of the lead frame (not shown). After this first stamping procedure, the fingers 104 of the shielding structure 103 are then held in place through the use of tape 106 that extends across each of the fingers 104. After the application the tape 106, the remaining support structures are removed by an additional stamping procedure or other suitable technique for removing the support structures.

Although the invention has been described using relative terms such as "down," "out," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein, if any, are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A packaged semiconductor device, comprising:
   a lead frame including a die flag and a plurality of leads surrounding the die flag; and
   a shielding structure comprising:
      a base located between the die flag and the leads; and
      a plurality of fingers, each finger extending from the base between a different pair of adjacent ones of the leads.

2. The semiconductor device of claim 1, wherein the shielding structure is electrically isolated from the die flag.

3. The semiconductor device of claim 1, wherein at least one of the fingers has a shape with a bend.

4. The semiconductor device of claim 1, wherein the lead frame comprises more than one shielding structure.

5. The semiconductor device of claim 1, wherein a width of a finger is not uniform along a length of the finger.

6. The semiconductor device of claim 1, wherein the fingers are longer than the leads.

7. The semiconductor device of claim 1, wherein at least two of the fingers have different lengths.

8. The semiconductor device of claim 1, wherein the base extends generally parallel to a side of the die flag and generally perpendicular to the respective fingers connected thereto.

9. The semiconductor device of claim 8, wherein at least one of the fingers extends at an angle other than 90 degrees from the base.

10. The semiconductor device of claim 8, wherein at least two of the fingers extend at different angles from the base.

11. The semiconductor device of claim 1, further comprising a tape that holds the fingers in place between the leads.

12. The semiconductor device of claim 1, wherein the shielding structure is connected to a ground voltage.

13. The semiconductor device of claim 1, wherein the fingers are at least partially covered with a non-conductive material in order to isolate the fingers from the leads.

* * * * *